United States Patent
Kwon

(10) Patent No.: US 6,438,027 B1
(45) Date of Patent: Aug. 20, 2002

(54) NONVOLATILE MEMORY, CELL ARRAY THEREOF, AND METHOD FOR SENSING DATA THEREFROM

(75) Inventor: Wook Hyun Kwon, Chungcheongbuk-do (KR)

(73) Assignee: Hyundai Electronic Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/942,541

(22) Filed: Aug. 31, 2001

Related U.S. Application Data

(62) Division of application No. 09/679,807, filed on Oct. 5, 2000.

(30) Foreign Application Priority Data

Oct. 7, 1999 (KR) .............................................. 99-43252

(51) Int. Cl.$^7$ ................................................ G11C 16/04
(52) U.S. Cl. ............................ 365/185.03; 365/185.01; 365/185.14; 365/185.24
(58) Field of Search ...................... 365/185.01, 185.03, 365/185.14, 185.18, 185.24, 185.28

(56) References Cited

U.S. PATENT DOCUMENTS

| | | | |
|---|---|---|---|
| 5,053,841 A | 10/1991 | Miyakawa et al. | 257/318 |
| 5,313,421 A * | 5/1994 | Guterman et al. | 365/185.03 |
| 5,364,806 A * | 11/1994 | Ma et al. | 438/266 |
| 5,723,888 A | 3/1998 | Yu | 257/319 |
| 6,044,015 A * | 3/2000 | Van Houdt et al. | 365/185.15 |
| 6,091,634 A * | 7/2000 | Wong | 365/185.14 |
| 6,144,586 A * | 11/2000 | Van Houdt et al. | 365/185.29 |
| 6,166,410 A | 12/2000 | Lin et al. | 257/324 |
| 6,236,082 B1 | 5/2001 | Kalnitsky et al. | 257/315 |
| 6,243,293 B1 | 6/2001 | Van Houdt et al. | 365/185.14 |

* cited by examiner

*Primary Examiner*—David Nelms
*Assistant Examiner*—Gene N. Auduong
(74) *Attorney, Agent, or Firm*—Morgan, Lewis & Bockius LLP

(57) ABSTRACT

Nonvolatile memory, cell array thereof, and method for sensing a data therefrom, the method including the steps of: selecting a flash memory cell having a first floating gate and a second floating gate, a first control gate and a second control gate, and a drain and a source; flowing a current through a first channel under the first floating gate and detecting a current flow through a second channel under the second floating gate, thereby sensing a color state of the second floating gate; flowing a current through the second channel and conducting level writings on the first floating gate, thereby forming different threshold voltages; measuring a cell current of the first channel under the first floating gate; comparing the measured cell current to a reference current, thereby sensing a level state of the first floating gate; and sensing information bits stored in the flash memory cell according to a color state of the second floating gate and a level state of the first floating gate.

5 Claims, 12 Drawing Sheets

(a)

(b)

(c)

(a)

(b)

(a)

(b)

(a)

(b)

(c)

(a)

(b)

(a)

(b)

NONVOLATILE MEMORY, CELL ARRAY THEREOF, AND METHOD FOR SENSING DATA THEREFROM

This is a divisional of copending Application Ser. No. 09/679,807, filed on Oct. 5, 2000, which is hereby incorporated by reference.

BACKGROUND OF THE INVENTION

This application claims the benefit of Application No. P1999-43252, filed in Korea on Oct. 7, 1999, which is hereby incorporated by reference.

FIELD OF THE INVENTION

The present invention relates to semiconductor memory, and more particularly, to nonvolatile memory, in which a flash memory cell having two floating gates is provided for storing a significant amount of information per cell, and a method for sensing data therefrom.

BACKGROUND OF THE RELATED ART

In general, there is a volatile memory which permits erasing stored information and saving new information and a nonvolatile memory which permits storing information only once. In the volatile memory, there are RAM data which are writable thereto and readable therefrom, and in the nonvolatile memory, there are ROM (Read Only Memory), EPROM (Erasable Programmable ROM), and EEPROM (Electrically Erasable Programmable ROM) data. The ROM cannot be programmed again once information is stored, but the EPROM and EEPROM can be programmed again once information stored therein is erased. The EPROM and EEPROM have the same information programming operation, but different information erasing operation. The EPROM erases information stored therein using a U.V. ray, while the EEPROM erases information stored therein using electricity. Keeping pace with demands for a large-sized memory according to the development of the information industry, DRAM is the most widely used as a mass storage media. However, DRAM requires a storage capacitor above a certain size which requires periodic refreshment. Accordingly, instead of DRAM, there have been extensive studies on EEPROM which requires no refreshment. However, since EEPROM also permits writing either '1' or '0' thereon, a device packing density corresponds to a number of memory cells. Therefore, when it is intended to use EEPROM as data storage media, the greatest problem is that the cost per bit is too high. In order to solve this problem, there is active research on a multi-bit memory cell. The multi-bit memory cell permits significantly increased data storage density in the same area of a chip without reducing memory cell size by storing two or more than two data in one memory cell. The multi-bit memory cell is programmed in multiple stages of threshold voltage levels. That is, in order to program two bits of data in one cell, each of the cells should be programmed in four stages of threshold voltage levels as is known from $2^2=4$. In this instance, the threshold levels in each cell correspond to logic states of 00, 01, 10, and 11. Accordingly, in order to increase a number of bits per cell by programming the cell in more levels, dispersion of each of the threshold voltage levels should be reduced by adjusting the threshold voltage levels precisely.

A related art nonvolatile memory, cell array thereof, and method for sensing data therefrom will be explained with reference to the appended drawings. FIGS. 1A and 1B illustrate unit cells of related art nonvolatile memory cells. FIG. 2 illustrates a cell array of related art nonvolatile memories. FIG. 3A illustrates cell states at threshold voltages according to the first related art method, and FIG. 3B illustrates cell states at control gate voltages and reference currents according to the first related art method.

The related art nonvolatile memory is flash memory, and a unit cell is provided with, as shown in FIGS. 1A and 1B, a stack of a first gate insulating film 2, a floating gate 3, a second insulating film 4, and a control gate 5 on a first conduction type semiconductor substrate 1, and second conduction type drain 6a and source 6b in the semiconductor substrate 1 on opposing sides of the floating gate 3. A channel region is formed in the semiconductor substrate 1 under the floating gate 3 when a write or read operation is performed.

Referring to FIG. 2, a cell array of related art nonvolatile memories is provided with a plurality of flash memory cells, wordlines 10, bitlines 11, sourcelines 12, and a common sourceline 13. There is a matrix of the plurality of flash memory cells each having a floating gate and a control gate, with the plurality of wordlines 10 formed in an axial direction for providing a voltage to control gates in the flash memory cells in a longitudinal direction. There is a drain contact DS for every two unit cells, and there are a plurality of the bitlines 11 disposed in a longitudinal direction, each connecting the drain contacts DS in the axial direction. And, there are a plurality of the sourcelines 12 disposed in the axial direction each connecting sources 6b of the unit cells in the longitudinal direction, and there is the common sourceline 13 disposed in the axial direction.

TABLE 1

|  | bitline | wordline | common sourceline |
|---|---|---|---|
| Programming | 5 ~ 6 V | 10 ~ 12 V | 0 V |
| Read | 1 V | 5 ~ 10 V | 0 V |
| Erase | float | −10 V or 0 V | 12 V or 3.3 ~ 5 V |

Write, read, and erase operations of the flash memory 14 selected from the related art nonvolatile memory having the aforementioned system will be explained with reference to FIGS. 1A and 2, and TABLE 1.

Referring to FIGS. 1A and 2, in the write operation, after selecting one of the flash memory cells at a crossing point of a selected wordline 10 and a selected bitline 11, a voltage of 5~6V is provided to a drain 6a of the selected flash memory cell, a voltage of 10~12V is provided to the wordline 10, and a voltage of 0V is provided to the common sourceline 13 causing current to flow in the channel, that, in turn, causes hot electrons to migrate from the channel to the floating gate 3 through the first gate insulating film 2. Upon reception of the electrons to the floating gate 3, the flash memory cell is involved in a pull up of the threshold voltage, stopping, the write operation when the threshold voltage reaches a desired threshold voltage.

Referring to FIGS. 1A and 2, in the read operation, after a voltage of 5~10V is provided to the wordline 10, a voltage of approximately 1V is provided to the bitline 11, and a voltage of 0V is provided to the common sourceline 13, current flowing, through the channel is sensed, and a threshold voltage corresponding to the current is read to read stored information.

Referring to FIGS. 1A and 2, in the erasure operation, the bitline 11 is floated, a voltage of −10 or 0V is provided to the wordline 10, a voltage of 12V or 3.3~5V is provided to the common sourceline 13, causing electron tunneling of electrons stored in the floating gate 3 to the source 6b through the first gate insulating film 2. In this instance, a plurality of the flash memory cells connected with the common source line 13 can be erased at the same time, block by block. Levels of the threshold voltages in the flash memory cell can be adjusted to provide states of 2, 4, 8, or over. A cell with equal to or more than four states is called as a multilevel cell.

TABLE 2

| 0 state | cell current > reference current |
| 1 state | cell current > reference current |

TABLE 3

| 00 state | first reference current > cell current |
| 01 state | second reference current > cell current > first reference current |
| 10 state | third reference current > cell current > second reference current |
| 11 state | cell current > third reference current |

Next, methods for sensing cells having one bit information which have two states, and cells having two bit information, which have four states, will be explained with reference to FIGS. 3A, 3B, TABLE 2, FIGS. 4A, 4B, and TABLE 3.

When one bit information is stored, a case where a cell current is higher than a reference current is defined as '0 state' and a case where the cell current is lower than the reference current is defined as '1 state', as illustrated in FIG. 3A and TABLE 2. The cell and reference currents are a result of measuring I-V characteristics of a flash memory cell where one reference threshold voltage is set. Since writing to many flash memory cells is conducted, the states show a state as shown in FIG. 3B that provides a read allowance (a value divided by two of a value obtained by subtracting a maximum current in the '1 state' from a minimum current in the '0 state'). As shown in FIG. 3B, first and second threshold voltages Vth1 and Vth2 have a distribution of '0' and '1' states, respectively. It is preferable that the read allowance is as large as possible for maintaining information in the flash memory cell, which requires narrower dispersions 'W' of the '0 state' and '1 state' threshold voltages, with a greater difference between the dispersions. By doing this, an allowance for setting the reference threshold voltage for reading a state of information stored in the flash memory cell becomes great.

A method for reading information from a flash memory cell having two bit information stored therein will be explained. FIG. 4A illustrates cell states at threshold voltages according to a second method of the related art, and FIG. 4B illustrates cell states at control gate voltages and reference currents accordingly.

Referring to FIG. 4A, in the related art two bit information sensing, a cell current is compared to first, second, and third reference currents (the first reference current being greater than the second reference current being greater than the third reference current), to represent as a '00' state when the cell current is greater than the first reference current, to represent as a '01' state when the cell current is greater than the second reference current and smaller than the first reference current, to represent as a '10' state when the cell current is greater than the third reference current and smaller than the second reference current, and to represent as '11' state when the cell current is smaller than the third reference current. As shown in FIG. 4A, illustrating current-voltage characteristic curves, there are first, second, third, and fourth threshold voltages Vth1, Vth2, Vth3, and Vth4 in the '00', '01', '10', and '11' states, respectively As shown in FIG. 4B, the first, second, third and fourth threshold voltages Vth1, Vth2, Vth3, and Vth4 have '00', '01', '10', and '11' dispersion states, respectively.

However, the related art nonvolatile memory and the method for sensing data therefrom has the following problems. First, in implementing a multi-bit cell in a flash memory cell, a difference of threshold voltages between states should be great for maintaining a great read allowance. The great difference of threshold voltages leads a control gate voltage higher, which increases a probability of electron leakage from a floating gate, which, in turn, causes the cell state to become unstable. Second, when a high voltage is provided to a control gate in order to obtain a greater read allowance, peripheral circuits become larger and more complicated. Third, since the storage of three bit information per one flash memory cell requires a higher control gate voltage and much time and effort to reduce dispersion of the threshold voltage, the storage of information of more than three bits is difficult.

SUMMARY OF THE INVENTION

Accordingly, the present invention is directed to a nonvolatile memory, a cell array thereof, and a method for sensing a data therefrom that substantially obviates one or more of the problems due to limitations and disadvantages of the related art.

An object of the present invention is to provide a nonvolatile memory, a cell array thereof, and a method for sensing a data therefrom, which can increase a read allowance of one flash memory cell, and store a significant amount of information.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the nonvolatile memory having unit cells, each unit cell includes a first gate insulating film formed on a semiconductor substrate; a first floating gate and a second floating gate formed on the first gate insulating film, the first floating gate being isolated from the second isolating gate; impurity regions formed on first sides of the first and second floating gates; a second gate insulating film formed on the semiconductor substrate inclusive of the first and second floating gates; a first control gate formed on the second gate insulating film covering a top portion and the first side of the first floating gate; and a second control gate formed on the second gate insulating film covering a top portion and the first side of the second floating gate, the second control gate being isolated from the first control gate.

In other aspect of the present invention, the cell array of nonvolatile memories includes a matrix of flash memory cells, each flash memory cell having a first floating gate and a second floating gate, a first control gate and a second control gate, and a drain and a source; a plurality of wordlines disposed in an axial direction and connected to the first control gates in a longitudinal direction; a plurality of distinguishlines disposed in the longitudinal direction perpendicular to the wordlines and connected to the second control gates in the axial direction; a plurality of bitlines disposed perpendicularly to the wordlines and connected to a power source contact; a plurality of groundlines disposed in the axial direction in parallel to the bitlines and connected to a ground contact; a plurality of drainlines disposed in the axial direction in parallel to the bitlines and contacting the drains in the axial direction; a plurality of sourcelines disposed in the axial direction parallel to the groundlines and contacting the sources in the axial direction; a plurality of drain selection transistors disposed between the plurality of drainlines and the power source contact; a plurality of drain selection lines disposed in parallel to the plurality of wordlines, thereby providing a drain selection signal to the plurality of drain selection transistors in the longitudinal direction; a plurality of source selection transistors disposed between the sourceline and the ground contact in the longitudinal direction; and a plurality of source selection lines disposed parallel to the plurality of wordlines, thereby providing a source selection signal to the plurality of source selection transistors in the longitudinal direction.

In another aspect of the present invention, there is provided a method for sensing a data in a nonvolatile memory, including the steps of selecting a flash memory cell having a first floating gate and a second floating gate, a first control gate and a second control gate, and a drain and a source; flowing a current through a first channel under the first floating gate and detecting a current flow through a second channel under the second floating gate, thereby sensing a color state of the second floating gate; flowing a current through the second channel and conducting level writings on the first floating gate, thereby forming different threshold voltages; measuring a cell current of the first channel under the first floating gate; comparing the measured cell current to a reference current, thereby sensing a level state of the first floating gate; and sensing information bits stored in the flash memory cell according to a color state of the second floating gate and a level state of the first floating gate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 1A:
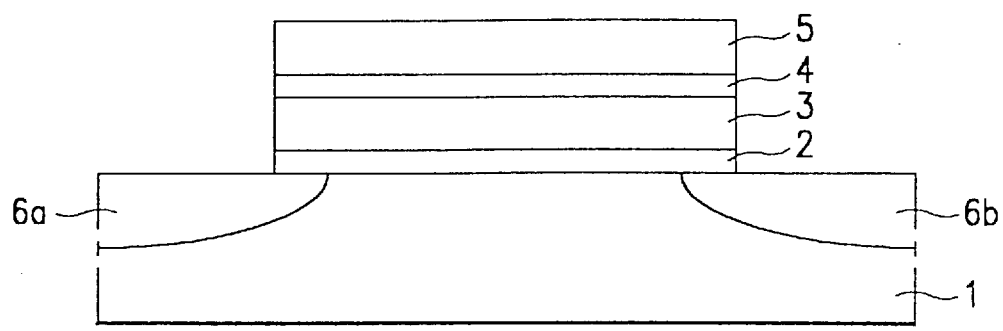
FIGS. 1A and 1B illustrate unit cells of related art nonvolatile memory cells.
Figure 1B:
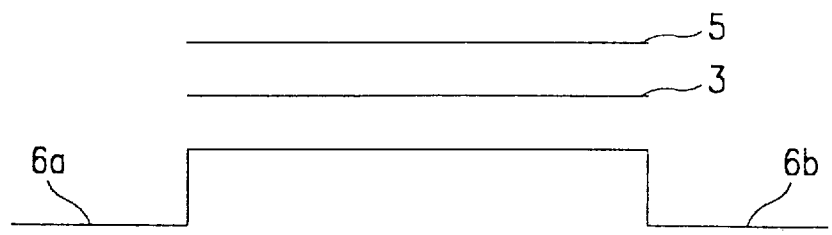
Figure 2:
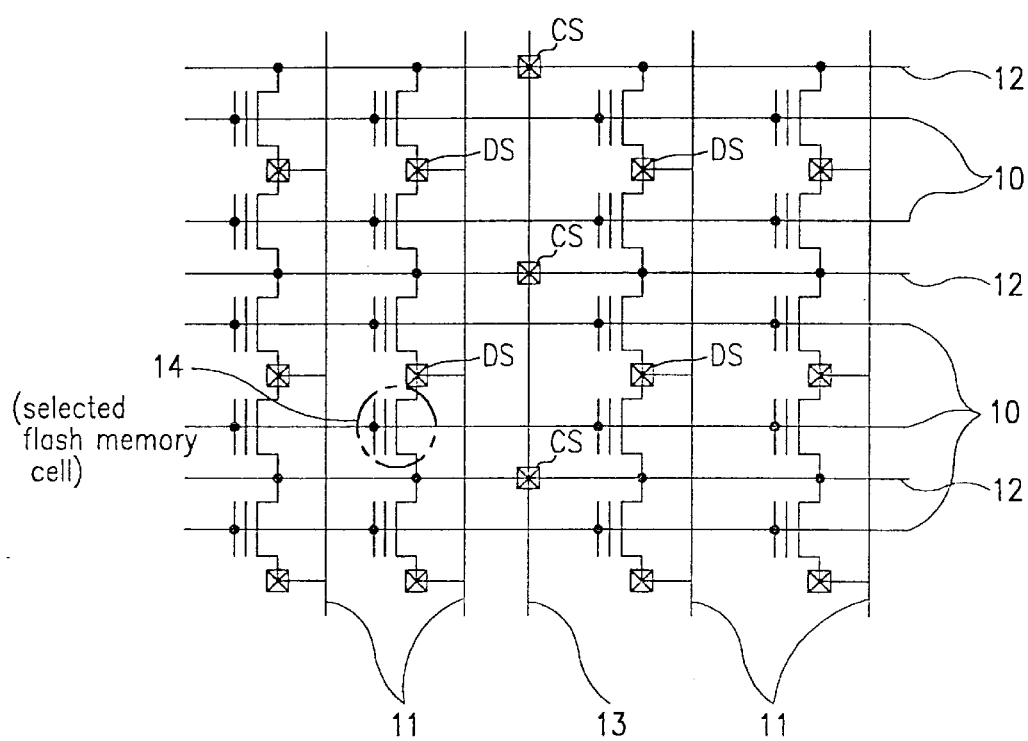
FIG. 2 illustrates a cell array of related art nonvolatile memories.
Figure 3A:
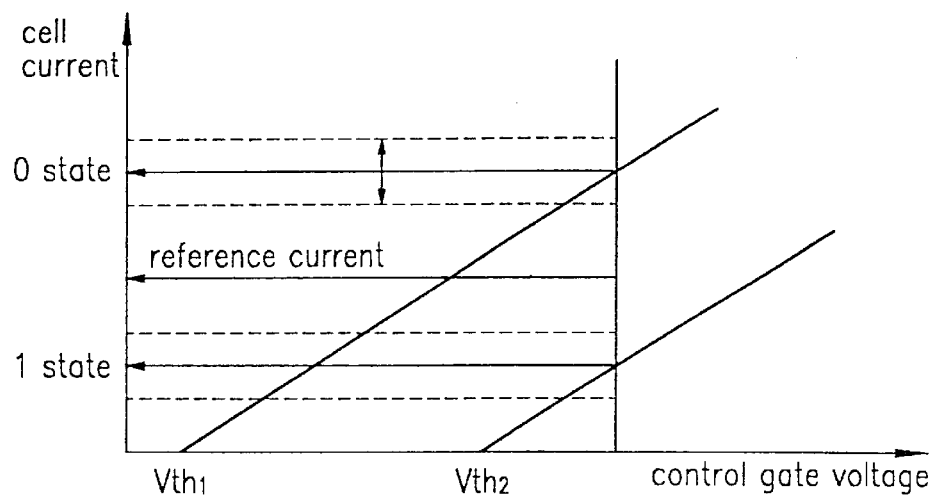
FIG. 3A illustrates cell states at threshold voltages according to a first method of the related art.
Figure 3B:
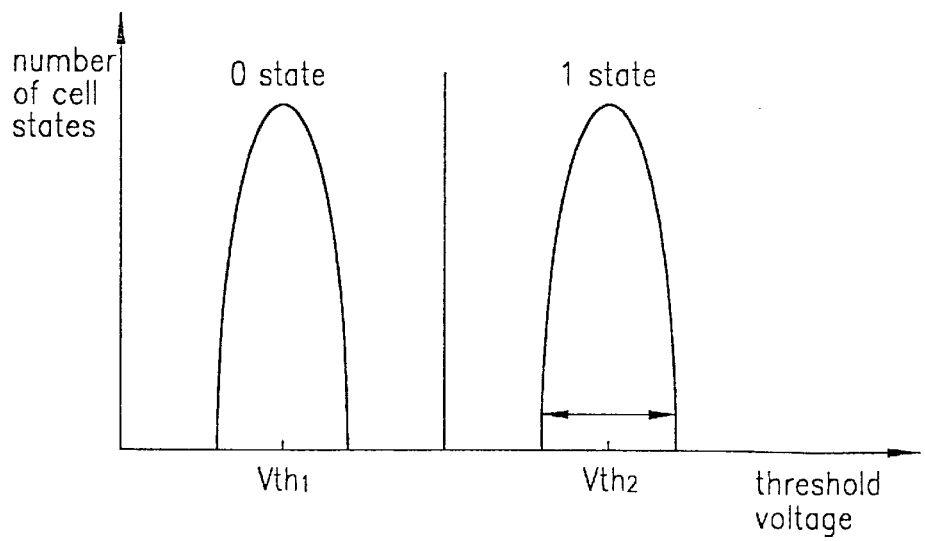
FIG. 3B illustrates cell states at control gate voltages and reference currents according to the first method of the related art.
Figure 4A:
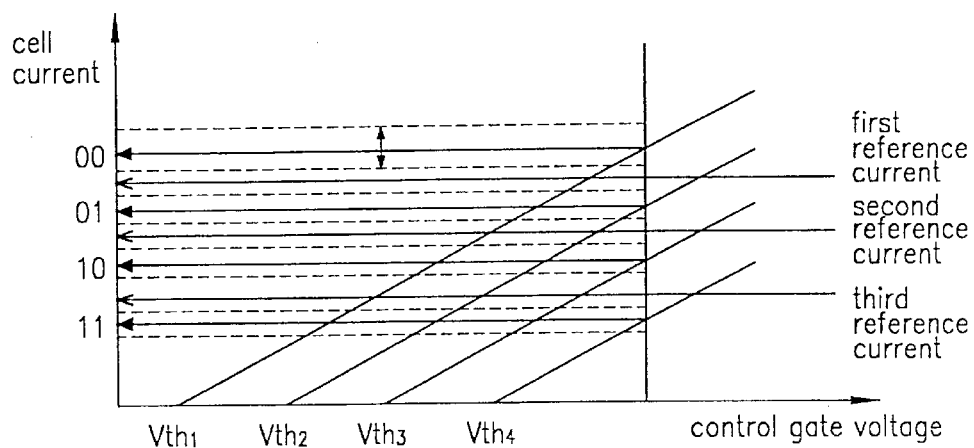
FIG. 4A illustrates cell states at threshold voltages according to a second method of the related art.
Figure 4B:
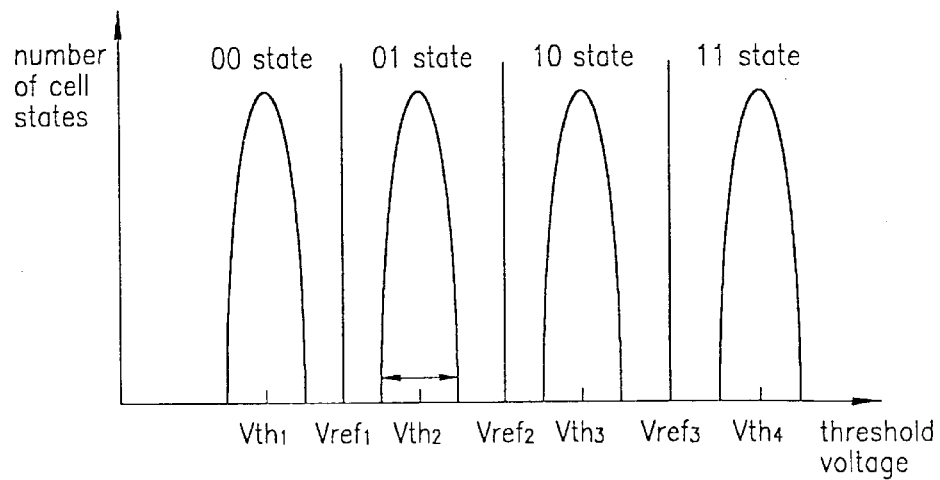
FIG. 4B illustrates cell states at control gate voltages and reference currents according to the second method of the related art.
Figure 5A:
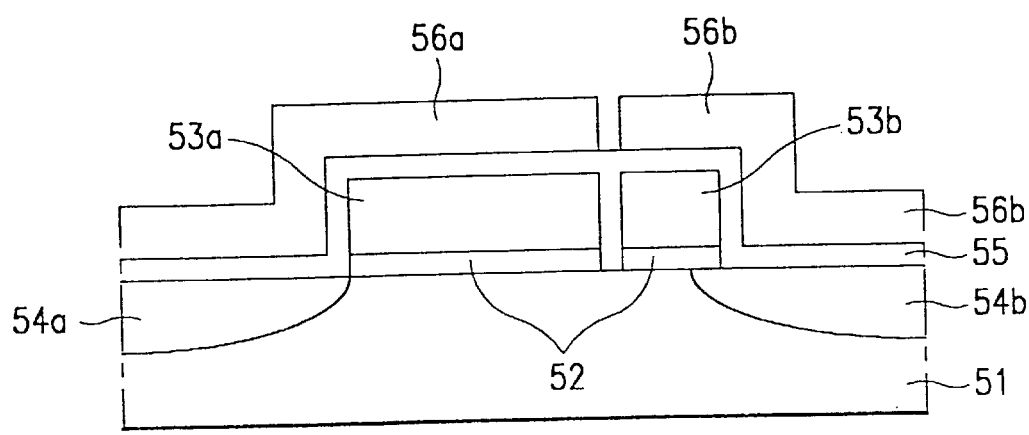
FIGS. 5A and 5B illustrate unit cells of nonvolatile memory cells according to a preferred embodiment of the present invention.
Figure 5B:
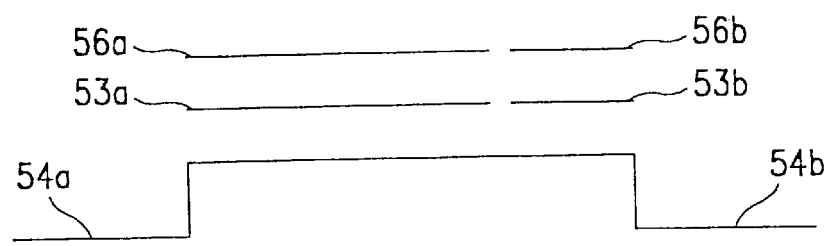
Figure 6:
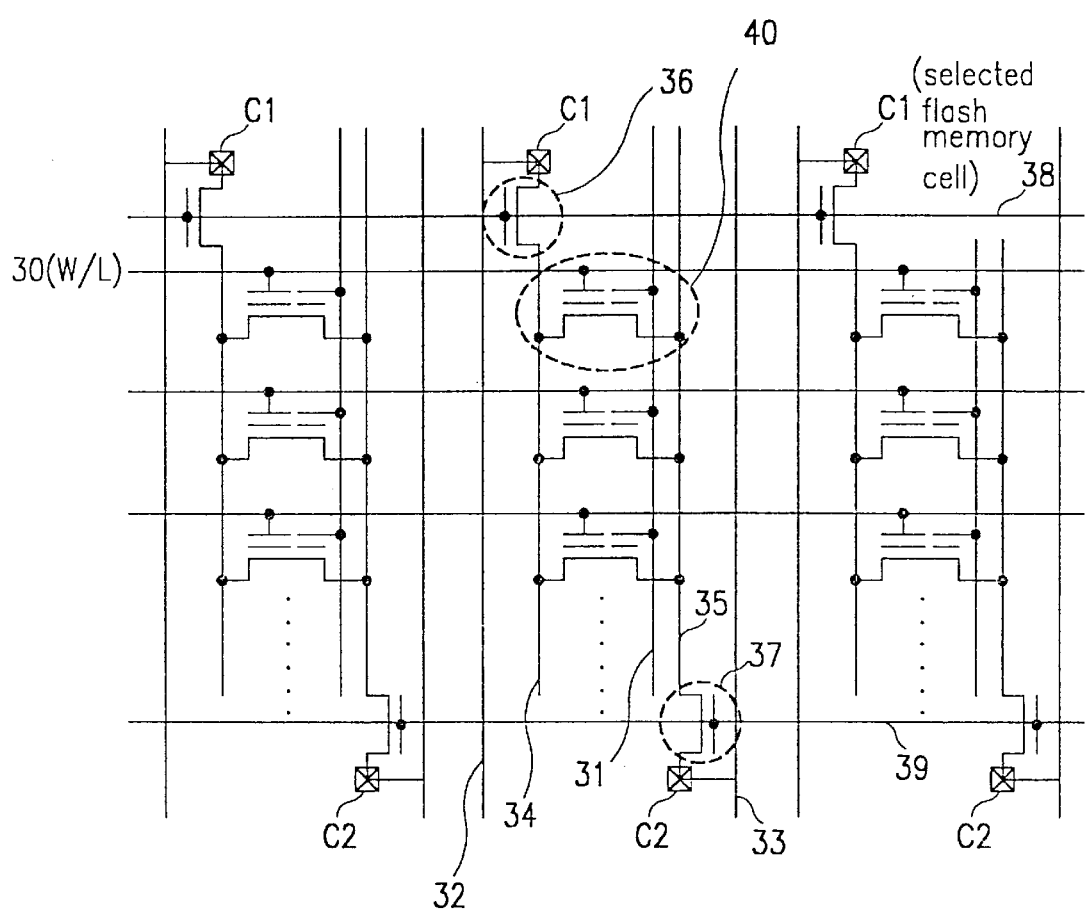
FIG. 6 illustrates a cell array of nonvolatile memories according to a preferred embodiment of the present invention.

FIGS. 5A and 5B illustrate unit cells of nonvolatile memory cells according to a preferred embodiment of the present invention, and FIG. 6 illustrates a cell array of nonvolatile memories according to a preferred embodiment of the present invention.

Referring to FIGS. 5A and 5B, a unit cell of a nonvolatile memory cell is a flash memory. cell having two floating gates in multi state and includes a first gate insulating film 52, divided into two pieces isolated from each other, formed on an active region of a semiconductor substrate 51, and first and second floating gates 53a and 53b formed on the first gate insulating film 52 isolated from each other. A drain 54a is formed in the semiconductor substrate 51 on one side of the first floating gate 53a, and a source 54b is formed in the semiconductor substrate 51 on one side of the second floating gate 53b. A region of the semiconductor substrate 51 under the first floating gate 53a between the drain 54a and the source 54b is defined as a first channel and a portion of the semiconductor substrate 51 under the second floating gate 53b is defined as a second channel. A second gate insulating film 55 is formed on the semiconductor substrate 51 inclusive of the first and second floating gates 53a and 53b in a first direction. A first control gate 56a is formed on the second gate insulating film 55 covering a top portion and one side of the first floating gate 53a. A second control gate 56b is formed on the second gate insulating film 55 covering a top portion and one side of the second floating gate 53b. In this embodiment, the first and second control gates 56a and 56b are isolated from each other. The first floating gate 53a and the second floating gate 53b are electrically floated by the second gate insulating film 55.

A cell array of nonvolatile memories of the present invention, in which the aforementioned flash memory cell is employed as a unit cell, will be explained next. Referring to FIGS. 5B and 6, the cell array of nonvolatile memories includes a matrix of flash memory cells each having first and second floating gates 53a and 53b, first and second control gates 56a and 56b, and a drain 54a and a source 54b. In this embodiment, the drain 54a is on one side of the first floating gate 53a, and the source 54b is on one side of the second floating gate 53b. The cell array of nonvolatile memories includes a plurality of wordlines 30, distinguishlines 31, bitlines 32, groundlines 33, drainlines 34, sourcelines 35, drain selection transistors 36, source selection transistors 37, drain selection lines 38, and source selection lines 39, forming the following system. The plurality of wordlines 30 are disposed in an axial direction and provide a signal to the first control gate 56a of the flash memory cells in a longitudinal direction. The plurality of distinguishlines 31 are disposed in the longitudinal direction perpendicular to the plurality of wordlines 30 and provide a signal to the second control gate 56b of the flash memory in the axial direction. The plurality of bitlines 32 and groundlines 33 are disposed parallel to each other and perpendicular to the plurality of wordlines 30 each for providing voltages to a power source contact C1 and a ground contact C2, respectively. One of the plurality of bitlines 32 and one of the plurality of groundlines 33 are disposed for every column of the flash memory cells. And, one of the plurality of drainlines 34 is disposed for the drain 54a of every column of the flash memory cells. One of the plurality of sourcelines 35 is disposed for the source 54b of every column of the flash memory cells. The drain selection transistor 36 is disposed between the drainline 34 and the power source contact C1 for receiving a drain selection signal, and the source selection transistor 37 is disposed between the sourceline 35 and the ground contact C2 for being driven in response to the source selection signal. The plurality of drain selection lines 38 are disposed in a direction parallel to the plurality of wordlines 30 each for providing a drain selection signal to gates of the drain selection transistors 36 disposed in the longitudinal direction, and the source selection lines 39 are disposed in a direction parallel to the wordlines 30 each for providing a source selection signal to gates of the source selection transistor 37 disposed in the longitudinal direction.

TABLE 4

| | bitline | drainline | sourceline | source | drain | distinguish- line |
|---|---|---|---|---|---|---|
| level write | 5 ~ 6 V | 12 V | 0 V | 5 V | 5 ~ 10 V | 10 ~ 12 V |
| level read | 1 V | 5 V | 0 V | 5 V | 7 ~ 10 V | 5 ~ 10 V |
| level erase | 12 V or 3.3 ~ 5 V | 15 V or 7 ~ 10 V | float | 0 V | 0 V or −10 V | float |
| color write | 0 V | 5 V | 5 ~ 6 V | 12 V | 10 ~ 12 V | 5 ~ 10 V |
| color read | 1 V | 5 V | 0 V | 5 V | 7 ~ 10 V | 0 V |
| color erase | float | 0 V | 12 V or 3.3 V ~ 5 V | 15 V or 7 ~ 10 V | float | 0 V or −10 V |

A method for sensing data using the aforementioned nonvolatile memory will be explained with reference to Table 4 and FIG. 6. Before explaining the data sensing operation, a flash memory cell of the present invention has two states for one threshold voltage with respect to a first control gate 56a. The two states for one threshold voltage are defined as different color states, that is called that the two states are degenerated for one threshold voltage. In this embodiment, 'the different color states' is defined as states when there are electrons present in a second floating gate 53b and when there are no electrons present in the second floating gate 53b that can be identified by current flowing through the second channel when the voltage is provided to the second control gate 56b. For example, a case is defined as 'white' when, after a voltage is provided to the wordline W/L, i.e., the first control gate 56a, for causing a current to flow to the first channel, the voltage is provided to the second control gate 56b, to cause current flowing to the second channel. And, opposite to the 'white', is a case when there is no current flowing to the second channel and is defined as 'black'. The 'white' is represented as logic '1', and the 'black' is represented as logic '0'. By setting two threshold voltages for the flash memory, and setting 'black' or 'white' for each of the two threshold voltages, at least four kinds of information can be stored in the flash memory cell. According the definition above, since the floating gate is divided to the first and second floating gates 53a and 53b, a data state can be expressed in at least two bit data depending on states in which charges are stored or not in the first and second floating gates 53a and 53b. In this embodiment, writing data on the first floating gate 53a is defined as 'level writing', reading data is defined as 'level reading', and erasing data is defined as 'level erase'. And, writing data on the second floating gate 53b is defined as 'color writing', reading data is defined as 'color reading', and erasing data is defined as 'color erasing'. The 'level writing' implies injection of electrons into the first floating gate 53a of a selected flash memory cell, the 'level reading' implies reading a threshold voltage of the flash memory cell stored in the first floating gate 53a of the selected flash memory cell, and the 'level erasing' implies extraction of electrons from the first floating gate 53a of the flash memory cell along a drain line of the selected flash memory cell. And, the 'color writing' implies injection of electrons to the second floating gate 53b of the selected flash memory cell, the 'color reading' implies reading a color state of the flash memory cell formed by the second floating gate 53b of the selected flash memory cell, and the 'color erasing' implies extraction of electrons from the second floating gate 53b of the flash memory cell along a source line of the selected flash memory cell.

The aforementioned different operations in the flash memory cell 40 selected from the nonvolatile memory of the present invention will be explained. As shown in FIGS. 5A, 6 and Table 4, in the 'level writing', a voltage of 10~12V is provided to the distinguish line 31, to cause current to flow through the second channel under the second floating gate 53b. Then, after a voltage of 5~6V is provided to the bitline 32, a bitline voltage is provided to the drainline 34 through the drain selection transistor 36. A voltage of 5~10V is provided to the wordline 30, to cause a current to flow through the first channel. Accordingly, electrons are moved from the source 54b to the drain 54a through the second channel and the first channel, when hot electrons are generated in the vicinity of the drain 54a which flow into the first floating gate 53a. As the hot electrons flow into the first floating gate 53a, the threshold voltage of the flash memory cell is increased to stop the level Writing when the threshold voltage reaches a desired level.

As shown in FIG. 6 and Table 4, in the level writing, a voltage of 5~10V is provided to the distinguish line 31 of the selected flash memory cell 40 to cause current to flow through the second channel under the second floating gate 53b. To cause current to flow through the first channel, after a voltage of 7~10V is provided to the wordline 30 and a voltage of 1V is provided to the bitline, a bitline 32 voltage is provided to the drainline 34 selected through the drain selection transistor 36, and current flowing through the flash memory cell is sensed to read the threshold voltage.

In the level erase, a voltage of 0 or −10V is provided to the wordline 30 of the selected flash memory cell 40, and a voltage of 7~10V or 15V is provided to the selected drainline 34, causing electron tunneling across the first gate insulating film 52 between the first floating gate 53a and the drain 54a, thereby carrying out the level erasing.

In the color writing, after a voltage of 10~12V is provided to the selected wordline 30, to cause a current to flow through the first channel under the first floating gate 53a, a voltage on the common sourceline is provided to the selected sourceline 35 using the source selection transistor 37, and a voltage of 5~10V is provided to the distinguish line 31, to cause a current to flow through the second channel, so that hot electrons generated in the vicinity of the source 54b through the second channel and the first channel from the drain 54a flow to the second floating gate 53b. As the hot electrons flow into the second floating gate 53b, the threshold voltage of the flash memory cell 40 is increased until the threshold voltage reaches a desired threshold voltage when the color write is stopped.

In the color reading, a voltage of 7~10V is provided to the selected wordline 30, to cause a current to flow through the first channel under the first floating gate 53a. Thereafter, a voltage below 1V is provided to the selected distinguish line 31, and a voltage of 1V is provided to the bitline 32, to sense current flowing through the second channel. The flash memory cell is determined to be white when there is current flowing through the second channel and to be black when there is no current flowing through the second channel.

In the color erase, a voltage of 0V or −10V is provided to the distinguish line 31, and a voltage of 5~6V is provided to the source line 35, to cause electron tunneling across the first gate insulating film 52 between the second floating gate 53b and the source 54b, thereby carrying out the color erase. For example, either a voltage of −10V is provided to the distinguish line 31 and a voltage of 3.3V~5V is provided to the source line 35, or a voltage of 0V is provided to the distinguish line 31 and a voltage of 12V is provided to the source line 35, so that the second floating gate 53b is erased excessively, causing current to flow through the second channel when voltage on the distinguish line 31 is low. In this instance, the drainline 34 is floated, to prevent a current to flow through the first channel.

Figure 7:
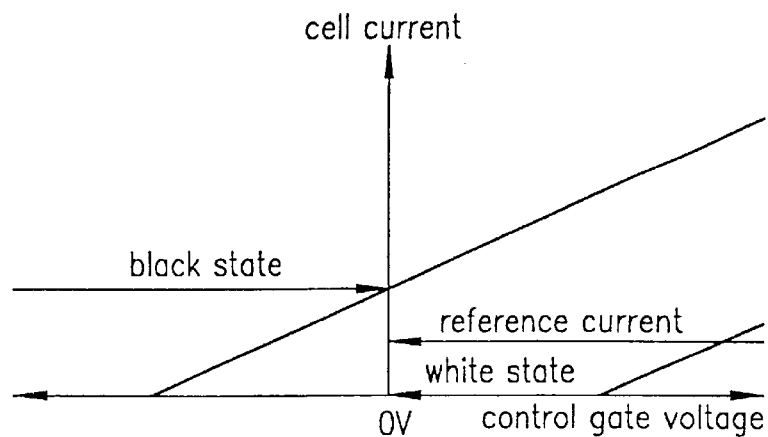
FIGS. 7A to 7C illustrate a method of sensing two bit information from a nonvolatile memory according to a preferred embodiment of the present invention.
Figure 7:
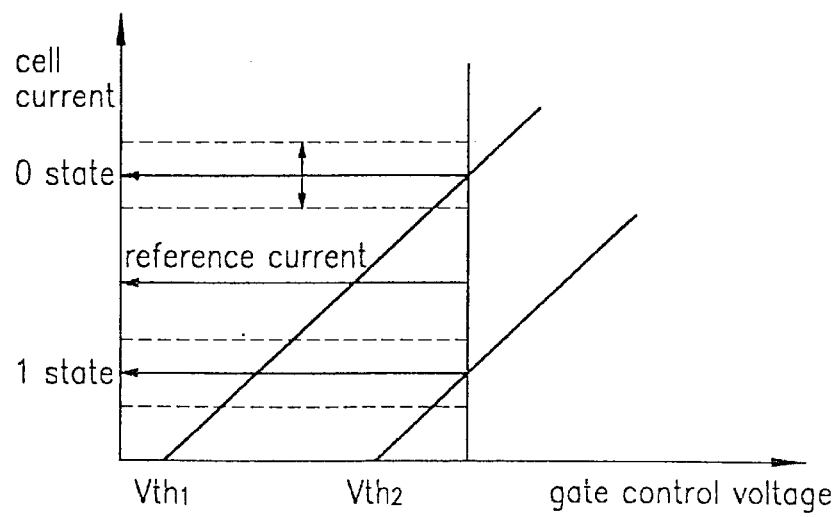
Figure 7:
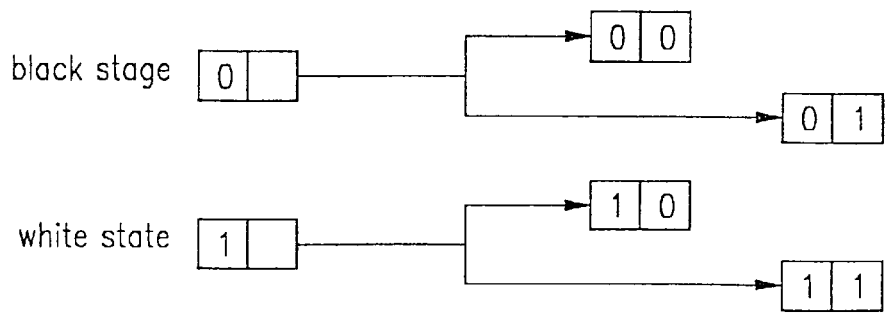
Figure 8:
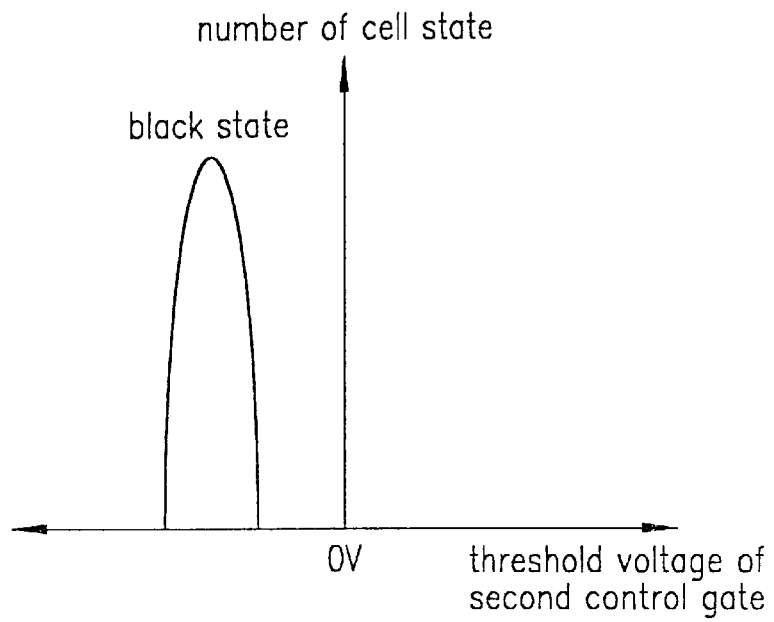
FIGS. 8A–8B and 9A–9B illustrate dispersions of threshold voltages according to a preferred embodiment of the present invention.
Figure 8:
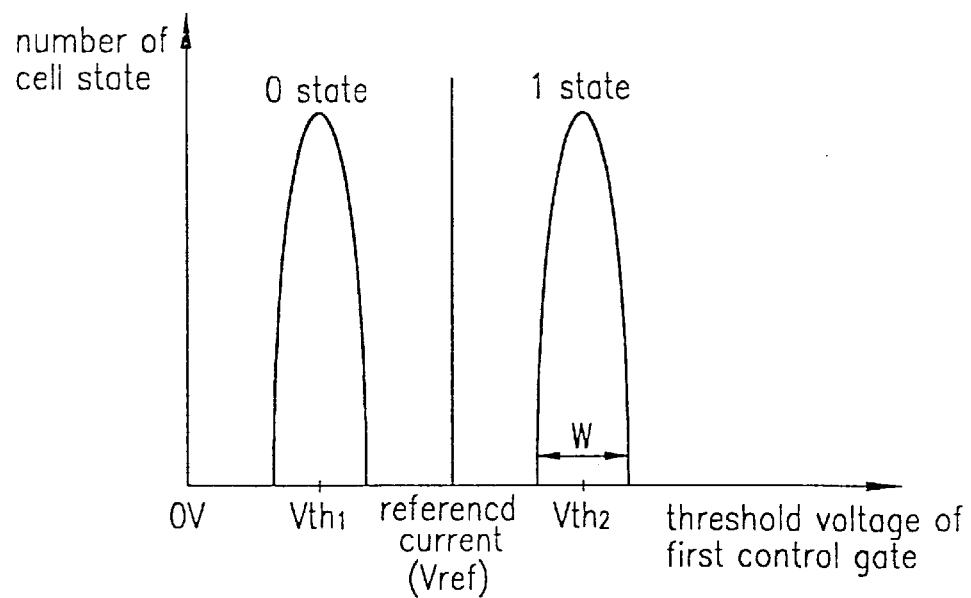
Figure 9:
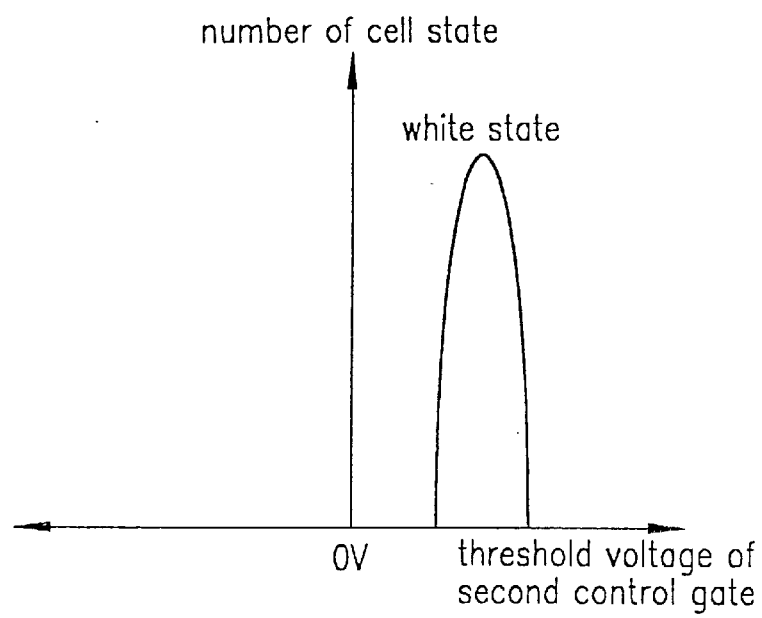
Figure 9:
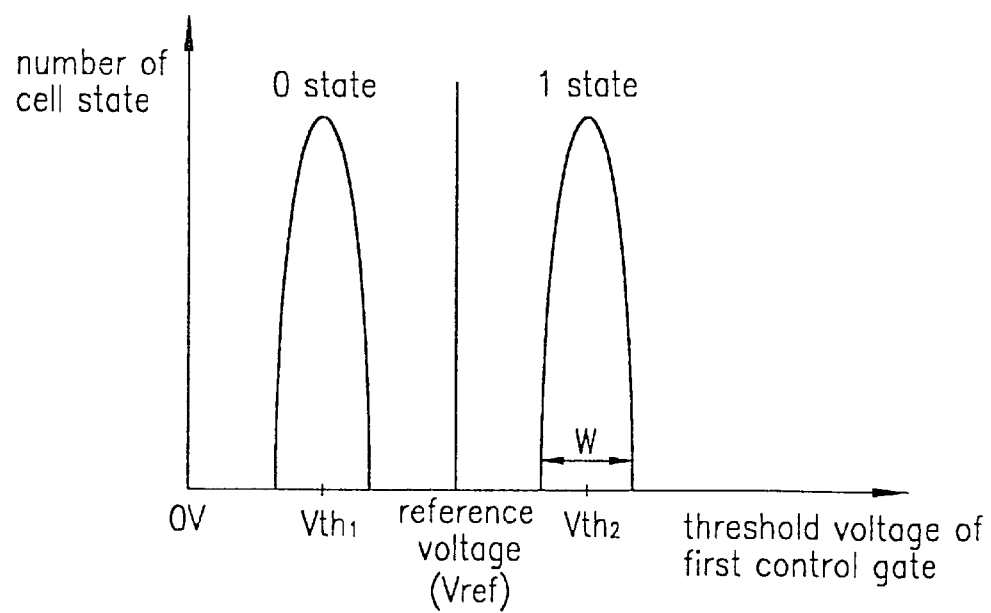

Two bit or three bit information may be stored in the nonvolatile memory of the present invention operative as above. As a preferred embodiment of the present invention, a method for reading a state of a nonvolatile memory in a case where two bit information is stored in a flash memory cell will be explained. FIGS. 7A to 7C illustrate a method of sensing two bit information from a nonvolatile memory according to a first preferred embodiment of the present invention. FIGS. 8 and 9 illustrate dispersions of threshold voltages according to a preferred embodiment of the present invention.

Storage of two bit information in a nonvolatile memory cell having two floating gates may provide four states depending on statuses of charge storage in first and second floating gates 53a and 53b. A method for sensing the four states will be explained.

A color reading operation is conducted, to detect current flowing through a second channel under the second floating gate 53b and to read a color state. Then, a level writing operation is used in programming first and second threshold voltages Vth1 and Vth2 in the first floating gate 53a. In this embodiment, an adequately high voltage of 10~12V is always provided to a distinguish line 31, and current is kept flowing through the second channel. A reference voltage is set up between the first and the second threshold voltages. A sensed current through the cell is dependent on the programmed first and second threshold voltages. That is, upon providing a read voltage to the wordline 30, the first floating gate 53a having the different threshold voltages programmed thus generates currents corresponding to respective states. The color state is read thus, and according to the read color state, 'level reading' is conducted. First, as shown in FIGS. 7A and 7B, when the color state is 'black' or 'white', the cell current is compared to the reference current, representing as a '0' state when the cell current is greater than the reference current, and as a '1' state when the cell current is smaller than the reference current. As shown in FIG. 7A, the 'white state' has a higher threshold voltage provided to the control gate than the 'black state' at which no current is in storage. When the second floating gate 53b is in the 'black state', the flash memory cell may be in '00' or '01' state. And, when the second floating gate 53b is in the 'white state', the flash memory cell 40 may be in '10' or '11' state. As has been explained, when two bit information can be stored in one flash memory cell. As shown in FIG. 7C, the flash memory cell 40 can be sensed in four states of '00', '01', '10', or '11'. Upon finishing the level writing on the flash memory cell, the flash memory cell 40 has threshold voltage dispersions according to the states that provide read allowances. As shown in FIGS. 7A to 7C, the read allowance is a value obtained by subtracting a maximum current in '1' state from a minimum current in '0' state and dividing by two. As shown in FIGS. 8A and 8B, in a preferred embodiment of the present invention, a first control gate 56a shows dispersions of '0' state and '1' state in first and second threshold voltages Vth1 and Vth2, respectively under the 'black state' in which no current flows through a second channel under a second floating gate 53b. As shown in FIGS. 9A and 9B, a first control gate 56a shows dispersions of '0' state and '1' state in first and second threshold voltages Vth1 and Vth2, respectively under the 'white state' in which current flows through a second channel under a second floating gate 53b. In this embodiment, a greater difference between the first and second threshold voltages Vth1 and Vth2 or smaller dispersion widths W will provide greater read allowances. Thus, the flash memory cell having two bit information stored therein may be sensed in four states of '00', '01', '10', or '11'.

Figure 10:
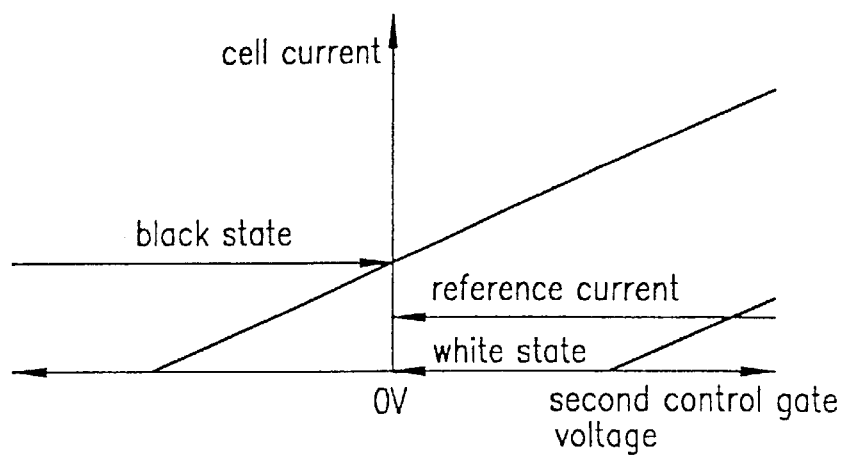
FIGS. 10A to 10C illustrate a method for sensing three bit information from a nonvolatile memory according to another preferred embodiment of the present invention.
Figure 10:
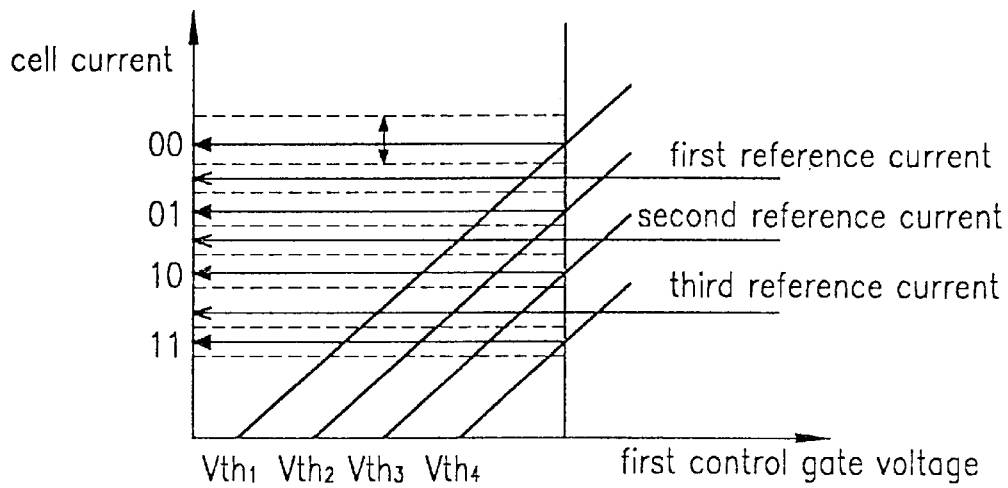
Figure 10:
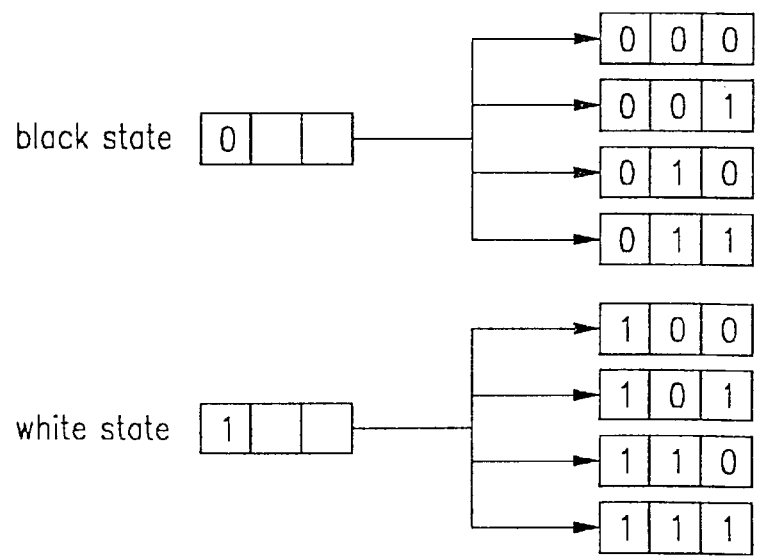
Figure 11:
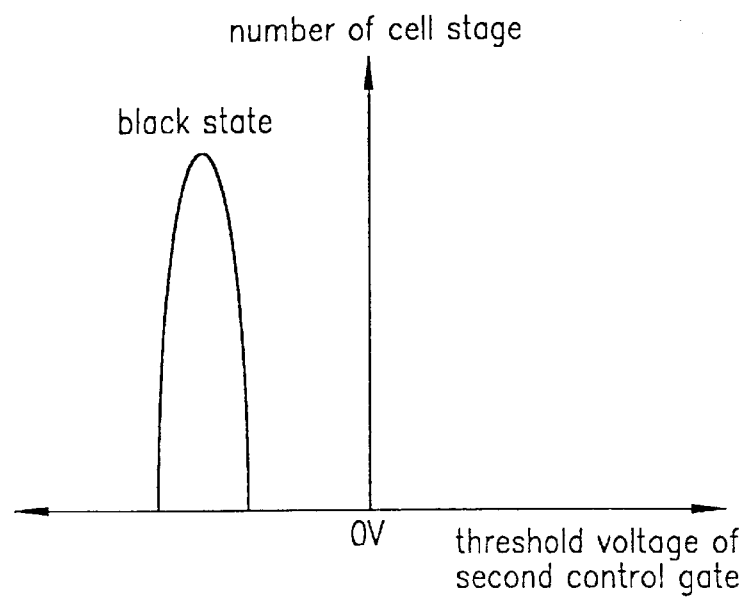
FIGS. 11A–11B and 12A–12B illustrate dispersions of threshold voltages according to another preferred embodiment of the present invention.
Figure 11:
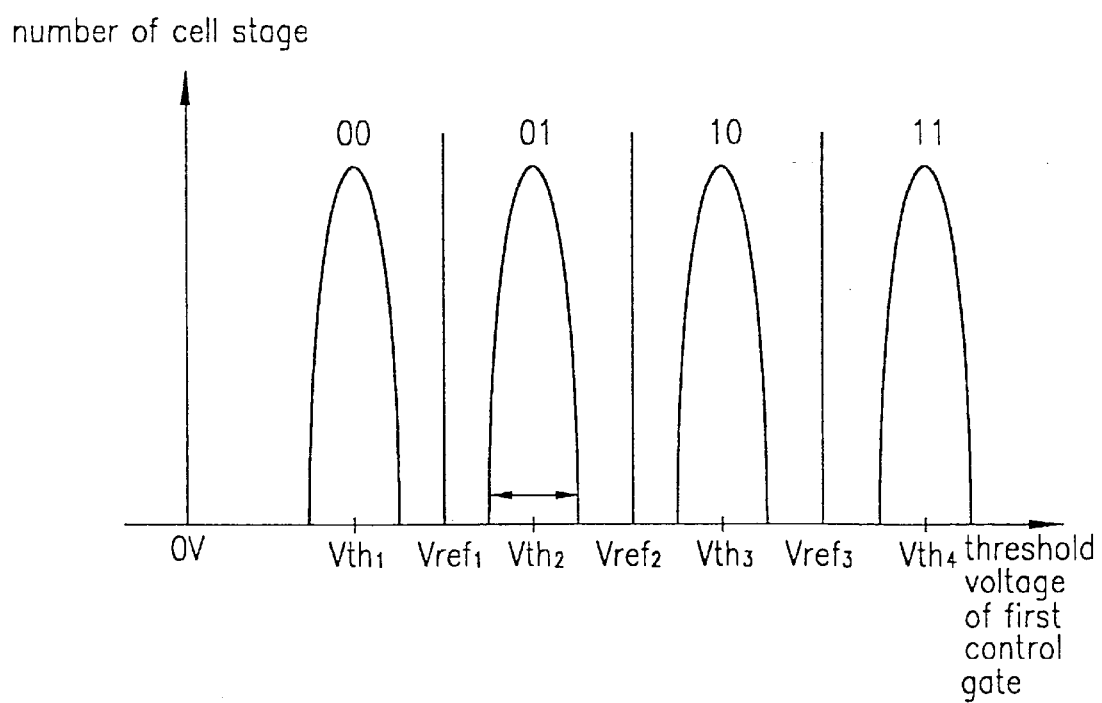
Figure 12:
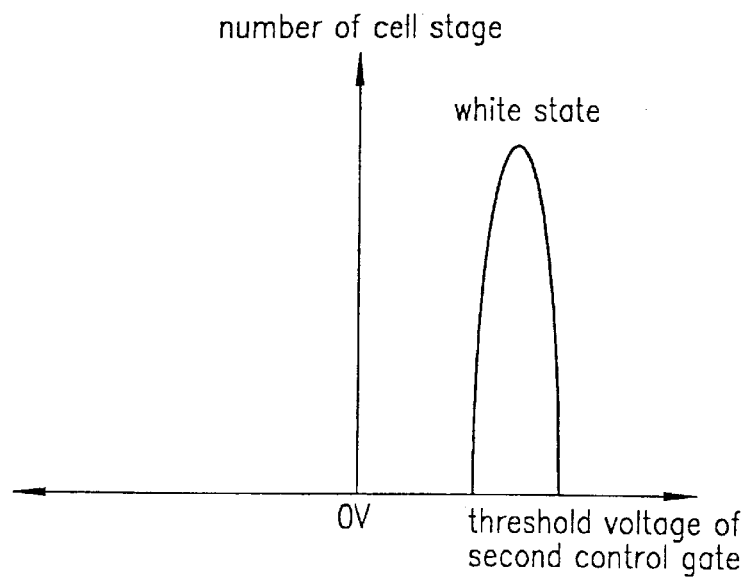
Figure 12:
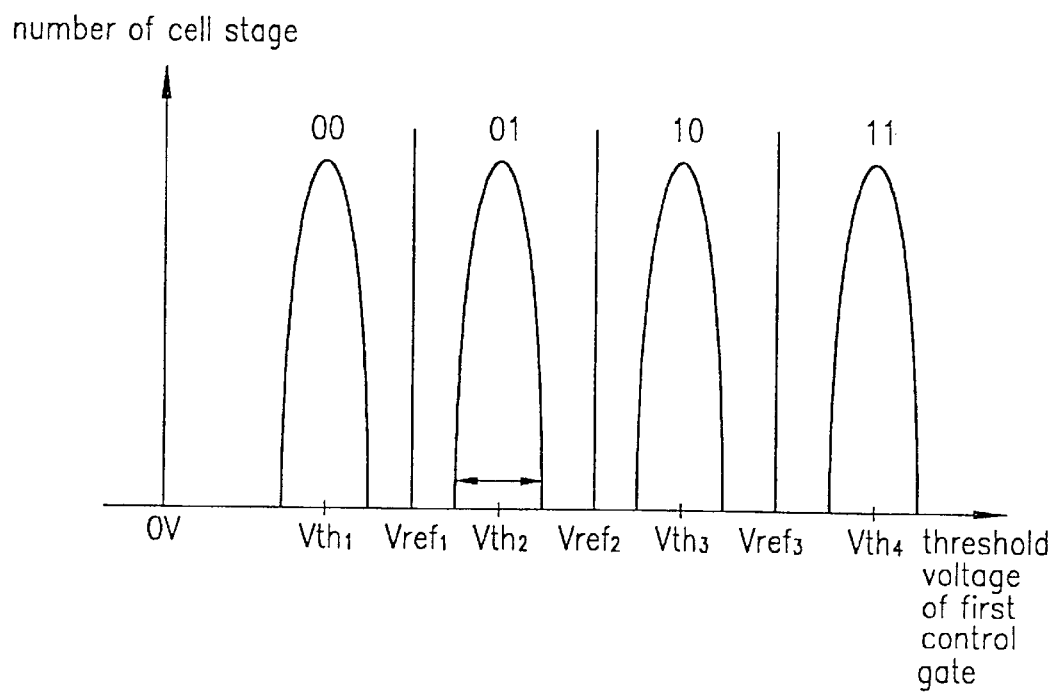

A method for sensing a nonvolatile memory in accordance with another preferred embodiment of the present invention will be explained when a flash memory cell 40 has three bit information stored therein. FIGS. 10A to 10C illustrate a method of sensing three bit information from a nonvolatile memory according to another preferred embodiment of the present invention, and FIGS. 11 and 12 illustrate dispersions of threshold voltages according to another preferred embodiment of the present invention. Storage of three bit information in a nonvolatile memory cell having two floating gates may be in eight different states coming from a combination of two color states depending on presence of a charge in a second floating gate 53b and four states in storing two bit information in a first floating gate 53a. Methods of sensing the eight states will be explained.

First, color reading is conducted, and current flow in a second channel under the second floating gate 53b is detected to read a color state. Then, level writing is used in programming first, second, third, and fourth threshold voltages Vth1, Vth2, Vth3, and Vth4 in a flash memory cell 40. In this embodiment, a distinguish line 31 always has an adequately high voltage of 10~12V provided thereto for causing current to flow through the second channel. First, second, and third reference voltages Vref1, Vref2, and Vref3 are set between the first, second, third, and fourth threshold voltages, respectively. In this embodiment, cell current is varied with the programmed threshold voltage. That is, upon providing a read voltage to the wordline 30, a first floating gate 53a has different threshold voltages programmed therein thus generating currents pertinent to the different states. Then, respective level readings are conducted according to the color states read by detecting currents flowing through the second channel. First, as shown in FIGS. 10A and 10B, when the color state is 'black' or 'white', respective cell currents are compared to the first, second, and third reference currents, to represent a case when the cell current is greater than the first reference current as '00' state, a case when the cell current is greater than the second reference current and smaller than the first reference current as '01' state, a case when the cell current is greater than the third reference current and smaller than the second reference current as '10', and a case when the cell current is smaller than the third reference current as '11' state. As shown in the I-V curve in FIG. 10A, the 'black state' has a threshold voltage lower than the 'white state'. As shown in FIG. 10C, when the 'black state' is represented with '0', the flash memory cell 40 may have four states of '000', '001', '010', and '011'. And, when the 'black state' is represented with '1', the flash memory cell 40 may have four states of '100', '101', '110', and '111'.

Next, as shown in FIGS. 11A to 11B, in another preferred embodiment of the present invention, a first control gate 56*a* shows four dispersions of '00', '01', '10' and '11' states in a first, second, third, and fourth threshold voltages Vth1, Vth2, Vth3, and Vth4, respectively under the 'black state' in which no current flows through a second channel under a second floating gate 53*b*. As shown in FIGS. 12A and 12B, the first control gate 56*a* shows four dispersions of '00', '01', '10' and '11' states in the first, second, third, and fourth threshold voltages Vth1, Vth2, Vth3, and Vth4, respectively under the 'white state' in which a current flows through the second channel under the second floating gate 53*b*. In this embodiment, a greater difference between the first to fourth threshold voltages or smaller dispersion widths W will provide greater read allowances.

The aforementioned nonvolatile memory, cell array thereof, and method for sensing a data therefrom have the following advantages. First, because the read allowance for two bits in the present invention is the same with the read allowance for one bit in the related art, and the read allowance for three bits in the present invention is the same with the read allowance for two bits in the related art, the present invention can provide a greater read allowance in storing information of the same size. Second, because the present invention permits storing three bit information for one flash memory cell, which is difficult to implement in the related art, a 256 Mbit flash chip can be embodied by using a process of fabricating 64 bit flash chip which stores one bit per cell.

It will be apparent to those skilled in the art that various modifications and variations can be made in the nonvolatile memory, cell array thereof, and method for sensing data therefrom of the present invention without departing from the spirit or scope of the invention. Thus, it is intended that the present invention cover the modifications and variations of this invention provided they come within the scope of the appended claims and their equivalents.

What is claimed is:

1. A method of sensing data in a nonvolatile memory comprising the steps of:

selecting a flash memory cell having a first floating gate and a second floating gate, a first control gate and a second control gate, and a drain and a source;

flowing a current through a first channel under the first floating gate and detecting a current flow through a second channel under the second floating gate, thereby sensing a color state of the second floating gate;

flowing a current through the second channel and conducting level writings on the first floating gate, thereby forming different threshold voltages;

measuring a cell current of the first channel under the first floating gate;

comparing the measured cell current to a reference current, thereby sensing a level state of the first floating gate; and sensing information bits stored in the flash memory cell according to a color state of the second floating gate and a level state of the first floating gate.

2. The method of sensing data according to claim 1, wherein the current flowing through the second channel is sensed as a white state, and no current flowing through the second channel is sensed as a black state.

3. The method of sensing data according to claim 1, wherein the threshold voltages of the first floating gate include threshold voltage levels of $2^K (K \geq 1)$.

4. The method of sensing data according to claim 1, wherein two bit information is stored in the flash memory cell, the second floating gate has two color states, and the first floating gate has two level states.

5. The method of sensing data according to claim 1, wherein three bit information is stored in the flash memory cell, the second floating gate has two color states, and the first floating gate has four level states.

* * * * *